United States Patent [19]

Kitayoshi

[11] Patent Number: 5,519,402
[45] Date of Patent: May 21, 1996

[54] DOPPLER SHIFT COMPENSATION APPARATUS

[75] Inventor: Hitoshi Kitayoshi, Tokyo, Japan

[73] Assignee: Advantest Corporation, Tokyo, Japan

[21] Appl. No.: 396,250

[22] Filed: Feb. 28, 1995

[30] Foreign Application Priority Data

Apr. 28, 1994 [JP] Japan ................ 6-113538

[51] Int. Cl.$^6$ ................ H04B 7/185
[52] U.S. Cl. ................ 342/196; 367/904
[58] Field of Search ................ 342/196, 192, 342/165, 99, 352, 358, 357; 367/904; 455/13.2, 71, 75, 89, 316, 12.1, 182.2; 370/104.1; 359/161

[56] References Cited

U.S. PATENT DOCUMENTS 5,432,521  7/1995  Siwiak et al. ................ 342/357

Primary Examiner—Daniel T. Pihulic
Attorney, Agent, or Firm—Knobbe, Martens, Olson & Bear

[57] ABSTRACT

A Doppler shift compensation apparatus for compensating Doppler frequency shifts in an incoming signal to reproduce a highly accurate signal. The Doppler shift compensation apparatus has high frequency dissolution ability and can detect a frequency, an amplitude and a phase of the incoming signal accurately. The Doppler shift compensation apparatus includes an analog to digital converter which transforms an analog input signal to digital data, a memory which stores the digital data from the analog to digital converter, a window function weighting part for multiplying a specified window function to input data from the memory, a fast Fourier transformer (FFT) for transforming the input data to frequency spectrum data, an interpolation judgment part which distinguishes line spectrum from dispersed spectrum in the frequency spectrum data from the fast Fourier transformer, a spectrum interpolator which measures the true frequency, amplitude and phase of the line spectrum based on the judgement of the interpolation judgement part, an accumulator for accumulating the frequency domain data interpolated by the spectrum interpolator, a summation part for vector-summing the frequency domain data accumulated by the accumulator to a Fourier transform output of the fast Fourier transformer, a regression computation part for performing a predetermined regression computation for the frequency data from the summation part based on the output data from the interpolation judgment part, and a subtractor for subtracting the output data of said regression computation part from the frequency data from the summation part.

3 Claims, 10 Drawing Sheets

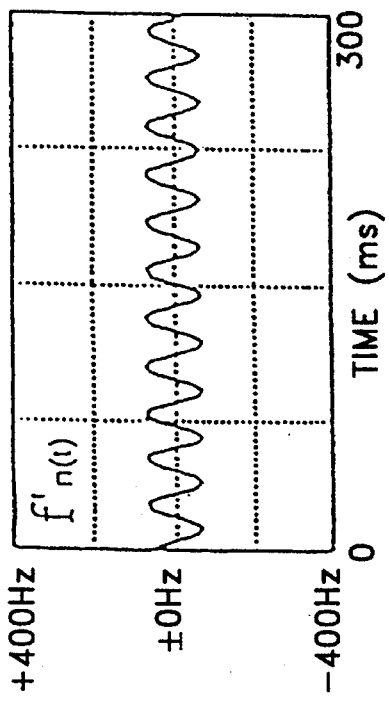
FIG. 5A₂
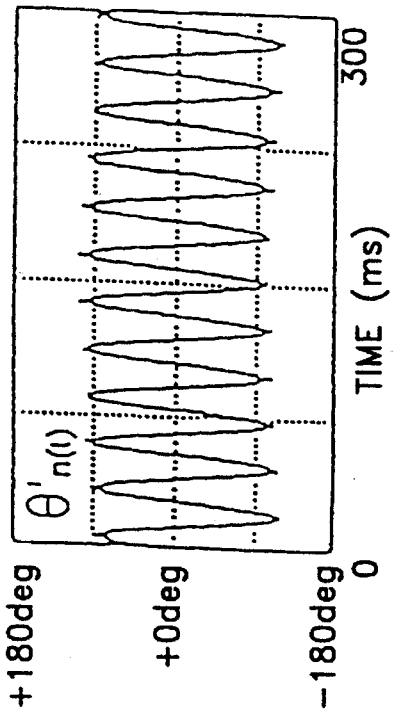
FIG. 5B₂
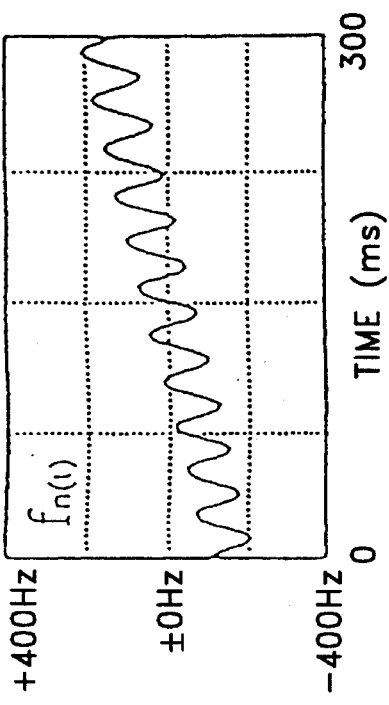
FIG. 5A₁
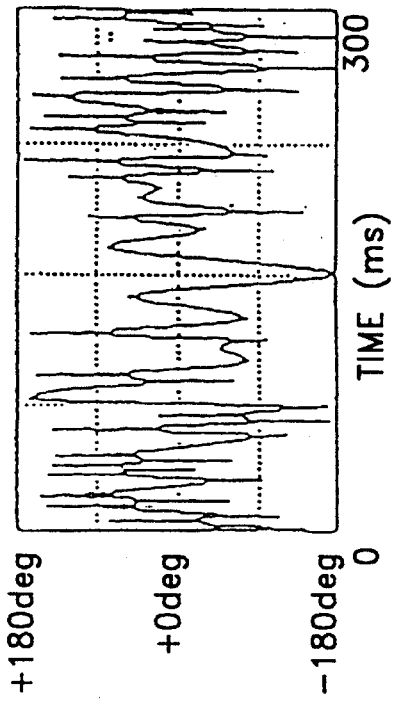
FIG. 5B₁

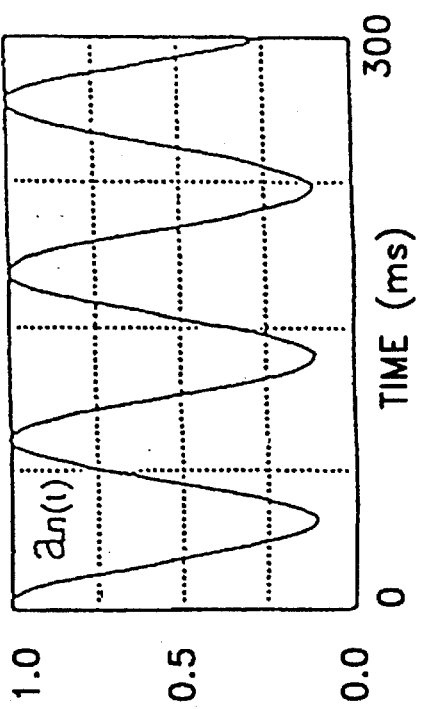
FIG. 5C₂
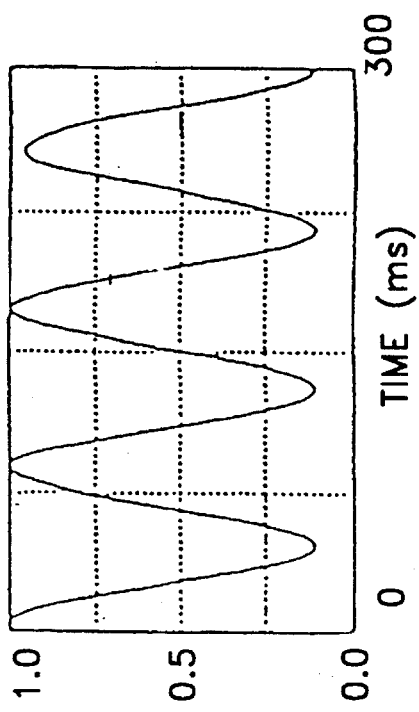
FIG. 5C₁

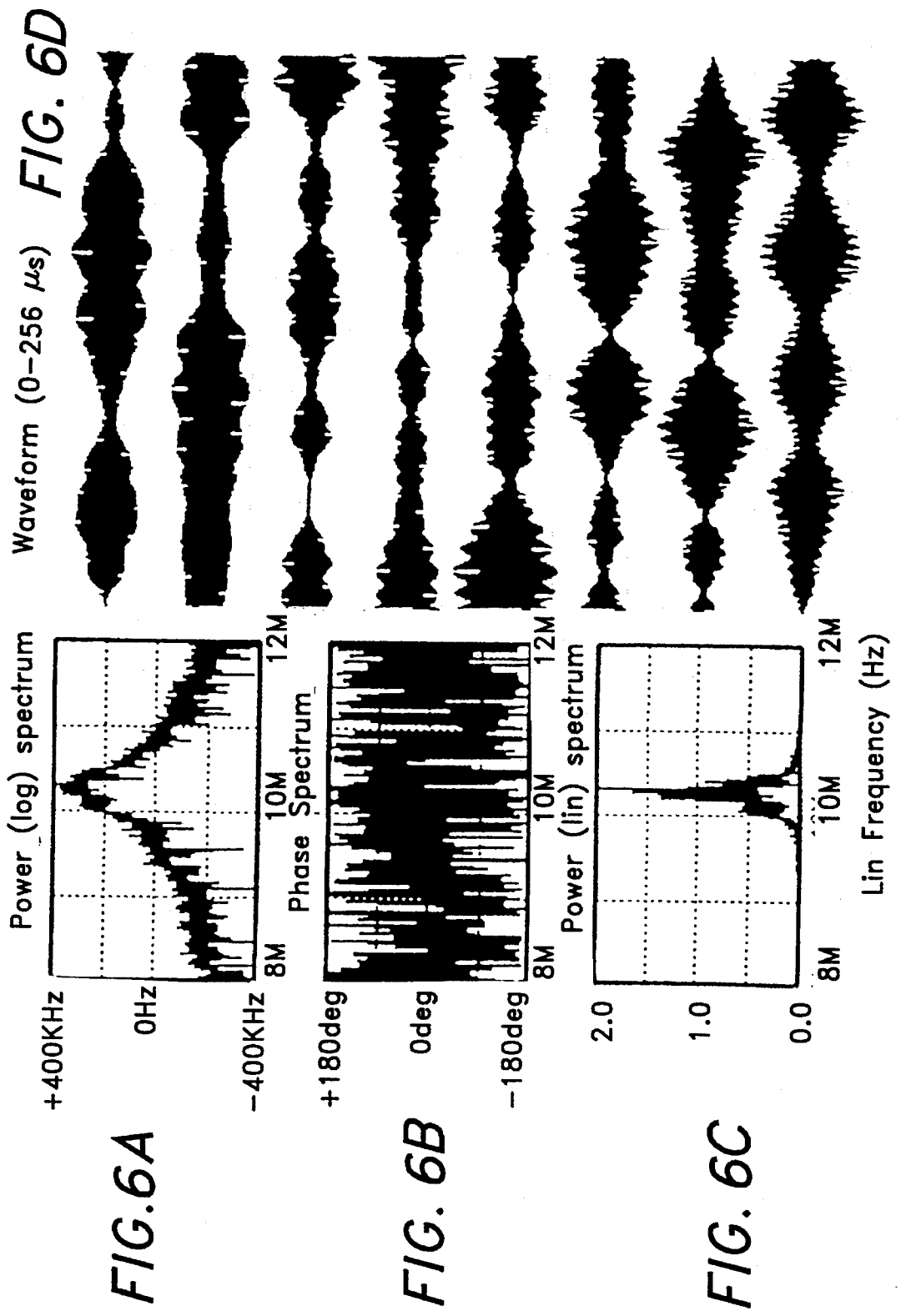

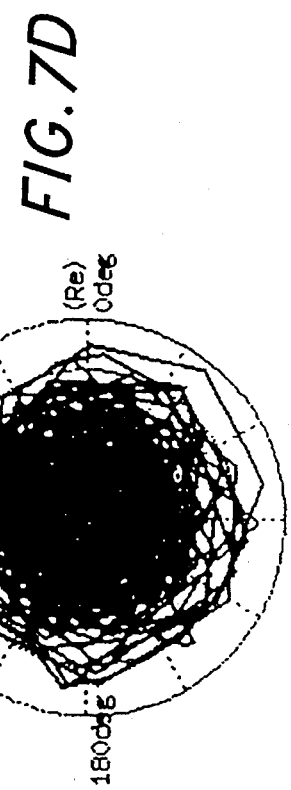
FIG. 7A
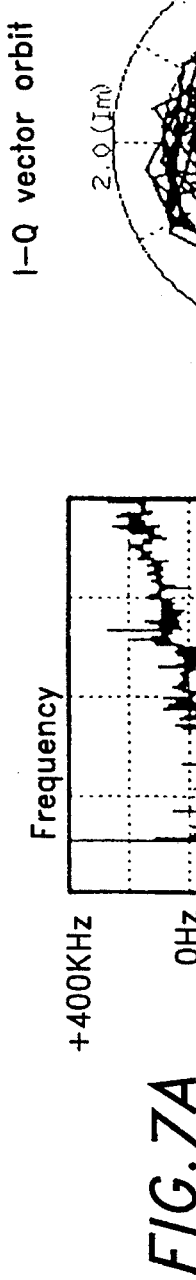
FIG. 7B
FIG. 7C
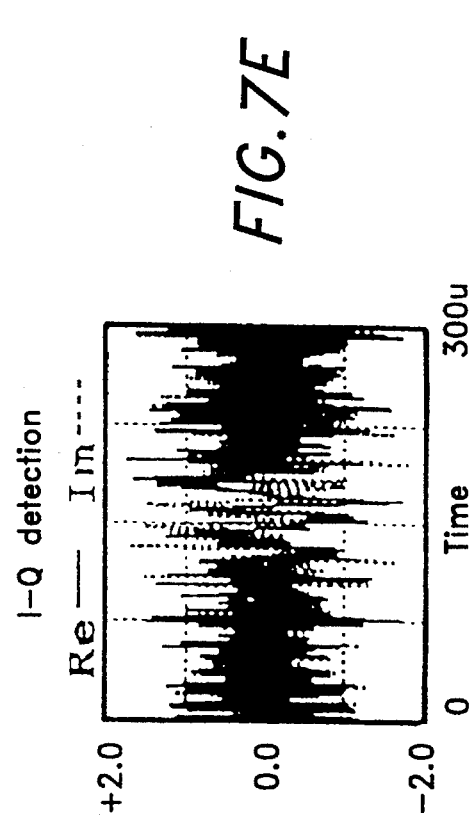
FIG. 7D
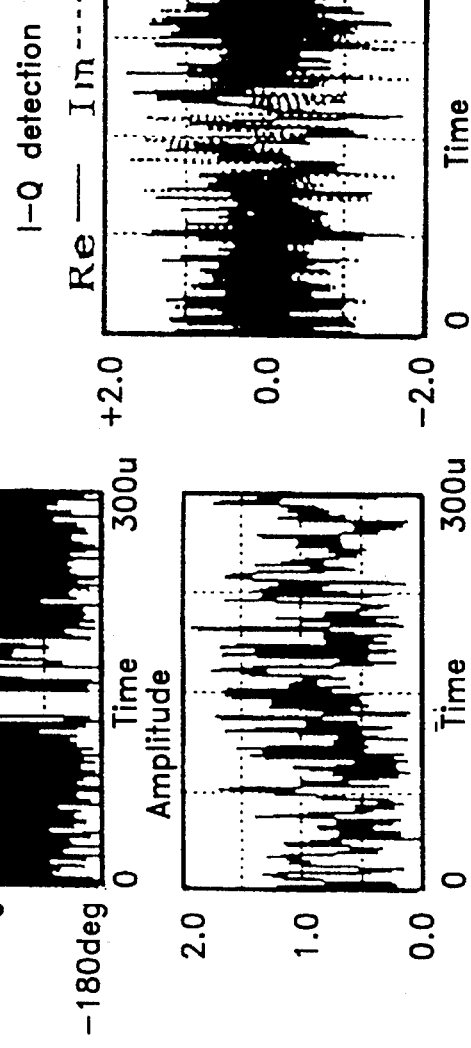
FIG. 7E

FIG. 9

| i | ai | fi(Hz) | $\theta_i$ (deg) |
|---|-----|--------|------------------|
| 1 | 1.0 | 5.55   | 0                |
| 2 | 0.8 | 10.66  | 30               |
| 3 | 0.6 | 15.77  | 60               |
| 4 | 0.4 | 20.88  | 90               |

FIG. 10

SPIM

< Frame (T = 1.0 s / 64 samples)

: $\Delta a = 50\%$, $\Delta f = 1 Hz$, $\Delta \theta = 180 deg$

; $f_{c1} = 12 Hz$, $f_{c2} = 18 Hz$ >

| A-to-D (bits) | Amplitude error (%) | Phase error (deg) | Frequency error (mHz) |
|---|-------|-------|--------|
| 2 | 16.78 | 27.96 | 176.1  |
| 4 | 3.72  | 4.67  | 22.98  |
| 6 | 1.65  | 1.28  | 9.39   |
| 8 | 0.92  | 0.91  | 5.17   |

DOPPLER SHIFT COMPENSATION APPARATUS

FIELD OF THE INVENTION

The present invention relates to a Doppler shift compensation apparatus which can obtain true frequency, amplitude and phase and, more particularly, to a compensation of the Doppler shifts for recovering and measuring a signal having a wide range of Doppler shift frequency such as a received signal from a low earth orbiting satellite by using a high resolution frequency analyzer device.

BACKGROUND OF THE INVENTION

In communications that use a low earth orbiting satellite, since the satellite moves at high speed, a Doppler frequency shift happens to a reception signal. In the Doppler shift in such a situation, the frequency of an incoming signal varies depending on the speed of the satellite. Because of this, an apparatus that reduces the error rate caused by the frequency shift is used. For example, there is a digital signal processing device that utilizes spectrum on the receiving side of the communication system.

FIG. 2 shows an example of conventional Doppler compensation system. As shown in FIG. 2, a differential mode FSK transmission signal from the satellite is received by the compensation system through a band pass filter (BPF) 1 that has a predetermined band width. The FSK transmission signal is transformed to two base band signals mutually associated with carrier wave frequency fc.

Next, these base band signals are transformed to digital data through an analog to digital convertor (ADC) 2 by a sampling frequency fs. The digital data that was sampled undergoes, to a certain degree, a frequency compensation by a digital signal processor 3, based on information from a frequency estimating device that includes a Fourier transformer (FFT) 4. Next, a signal is reproduced based on these data to obtain spectrum for each transmission symbol, by using a short time Fourier transformer (STFT) 5.

This conventional system has a relatively simple structure as described above and can compensate the Doppler shift frequencies up to, for example, a change rate of 100 Hz per second. However, this compensation range is insufficient for the modern communication system.

Generally, the amount of Doppler shift frequency is determined by a relative speed between an observer and a satellite and a carrier frequency of the communication signal. For example, if the carrier frequency is 1 GHz, the Doppler shift may be about 100 Hz/sec. If the carrier frequency becomes 10 GHz, then the Doppler shift frequency may reach to 1 kHz/sec.

In today's digital radio communication system, for example in cellular communication system, a low earth orbiting (LEO) satellite is utilized which includes a digital modulation method of quaternary phase shift keying (QPSK). In such system, a microwave band or a millimeter wave band may be utilized as a carrier frequency. Because the carrier frequency is high, comparatively fast Doppler shift fluctuations are experienced. Accordingly, these Doppler shifts need to be compensated to carry out high quality demodulation and measurement.

However, the conventional Doppler shift frequency compensation is incapable of compensating the wide range of frequency shift as may be experienced in the LEO satellite communication. In addition, the following disadvantages are associated with the conventional compensation system utilizing the short time Fourier transformer (STFT).

First, by accumulating digital data with sampling period T in the analog to digital converter ADC2, the resolution of analyzed spectrum is limited to 1/T(Hz). As a result, the frequency spectrum cannot be measured at higher resolutions than this limitation.

Second, a vector analysis frequency obtained by the FFT means 4 is discrete [n/T(Hz): n is an integer]. Therefore, if the frequency spectrum of the analog input signal does not match n/T(Hz), the amplitude value of the analyzed frequency spectrum may be adversely altered.

Third, when performing a spectrum analysis utilizing a FFT means 4, there is no significance in having an absolute phase. In other words, the absolute phase of the spectrum cannot be measured utilizing FFT means.

SUMMARY OF THE INVENTION

The object of the present invention is to overcome the above listed disadvantages and provide a high quality demodulation and measurement Doppler shift compensation apparatus, having higher frequency dissolution ability for wider range of frequencies wherein Doppler shifts are compensated by using a high resolution frequency analyzer device that can detect an amplitude and a phase of a spectrum with high accuracy.

The present invention comprises a Doppler shift frequency compensation apparatus and is characterized by the following: The compensation apparatus includes an AD (analog-to-digital) converter in which an analog input signal including Doppler frequency shifts is transformed to a serial digital data train. A memory is employed to sequentially store the input data train that was transformed to digital data by the AD converter. The data train from the memory is provided to a high resolution frequency analyzer. In the high resolution frequency analyzer, a window function weighting circuit is used for multiplying and weighting a specified window function to a part of the input digital data train that has been stored in the memory.

Further, a fast Fourier transformer (FFT) is used for transforming the input digital data train which is read out from the window function weighting circuit to frequency domain data. Then, it is judged by an interpolation judgement circuit whether the cut out frequency spectrum that is obtained by the fast Fourier transformer is a group of line spectrum or the spectrum that spread continuously in time.

If the frequency spectrum is judged to be line spectrum, the interpolation judgment circuit determines that the spectrum is suitable for an interpolation process. A spectrum interpolator estimates the absolute value of real frequency, amplitude, phase of the spectrum which is appointed as suitable for the interpolation by the interpolation judgement circuit. An accumulator is used for accumulating the frequency domain data interpolated by the spectrum interpolator. The apparatus includes an adder so that the Fourier transformed output data from the fast Fourier transformer (FFT) is added in a vector form to the interpolated data accumulated in the accumulator.

A regression computation circuit is used for computing regression for the data from the adder. A subtractor is provided for subtracting the output data of the regression computation circuit from the frequency data supplied by the adder. An integration circuit is used for performing a predetermined integration for the data from the above regression computation circuit. Another subtractor is used for subtracting the output data of the integration circuit from phase data supplied by the adder. An output means is used for outputting the amplitude data from the adder, the frequency data from the subtractor and the phase data from the another subtractor, respectively, wherein the phase data and the frequency data are compensated in terms of the Doppler shifts.

According to the present invention, the interpolation judgment means determines whether or not the frequency spectrum output from the FFT means is the line spectrum. If the frequency spectrum is found to be the line spectrum, the frequency, amplitude and phase of the line spectrum which are presumed to be true values and can be obtained through a calculation process. This procedure for the frequency spectrum is unrelated to the sampling period T or the discrete frequency n/T(Hz) of the FFT means. Thus, the frequency, amplitude and phase of the spectrum obtained can be highly accurate since these parameters are not affected by the discrete frequency n/T(Hz) or the sampling period T.

The frequency domain data, which is presumed to be true and correct under the foregoing process, is accumulated by the accumulator. The accumulated frequency domain data is then vector-summed and the summed result is outputted from the high resolution frequency analyzer. Therefore, in accordance with the present invention, the frequency, amplitude and phase of the line spectrum are interpolated to become true and complete values. Further, for the spread frequency spectrum which is due to frequency fluctuations, for example, the FFT output power is given as the measured value without interpolation.

For the frequency domain data fn(t) in the output signal from the high resolution frequency analyzer, a predetermined regression computation is carried by regression computation circuit so as to obtain a signal function Fn(t). The output signal fn(t) from the high resolution frequency analyzer is subtracted by the signal Fn(t) in the subtractor. As a result, the Doppler shift is compensated and the resulted signal is obtained as fn'(t). Also, regarding the phase data θn(t) in the output signal from the high resolution frequency analyzer, a predetermined integration operation is carried out in the integration computation circuit for the signal Fn(t) which is output by the regression computation circuit. In a subtractor, the output data from integration computation circuit subtracts from the phase data θn(t), which results the Doppler compensated phase data θn'(t). The output data from the high resolution frequency analyzer is used as indicating an amplitude data an (t).

Therefore, according to the present invention, the frequency data fn'(t) and the phase data θn'(t), both of which are compensated in the Doppler shifts, and the amplitude data an(t) can be obtained from the output means. Furthermore, additional signal processing such as analyzing the demodulated and Doppler compensated communication signal from the output means or measuring and displaying the data signal from the output means are possible.

BRIEF DESCRIPTION OF THE DRAWINGS

FIGS. 5A1, 5A2, 5B1, 5B2, 5C1 and 5C2 are waveforms showing the differences before the Doppler shift compensation and after the Doppler shift compensation in accordance with the present invention.

FIG. 6 is a schematic for showing spectrum distribution in the incoming signal.

FIG. 7 shows instantaneous spectrum versus time prior to the Doppler shift compensation.

FIG. 9 is a table showing multiple tone conditions wherein frequency spectrum be accomplished by a conventional short time frequency transform (STFT) method and the spectrum interpolation method (SPIM) of the present invention.

FIG. 10 shows the relation between the sampling bits and the SPIM spectrum analysis error in accordance with the present invention.

DETAILED DESCRIPTION OF THE INVENTION

Figure 1:
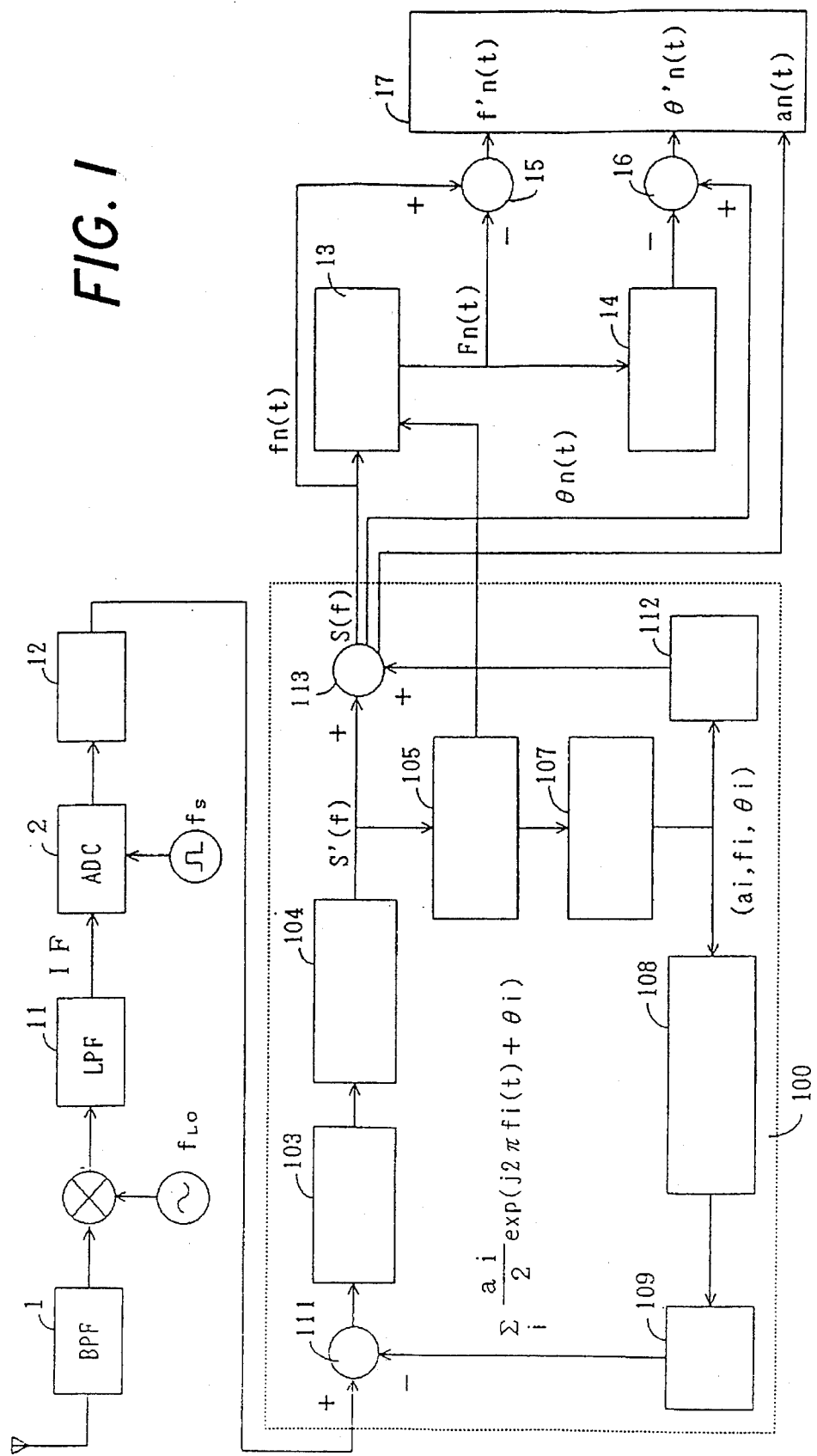
FIG. 1 is a block diagram showing a preferred embodiment of a Doppler shift compensation apparatus of the present invention using a high resolution frequency analyzer.
Figure 2:
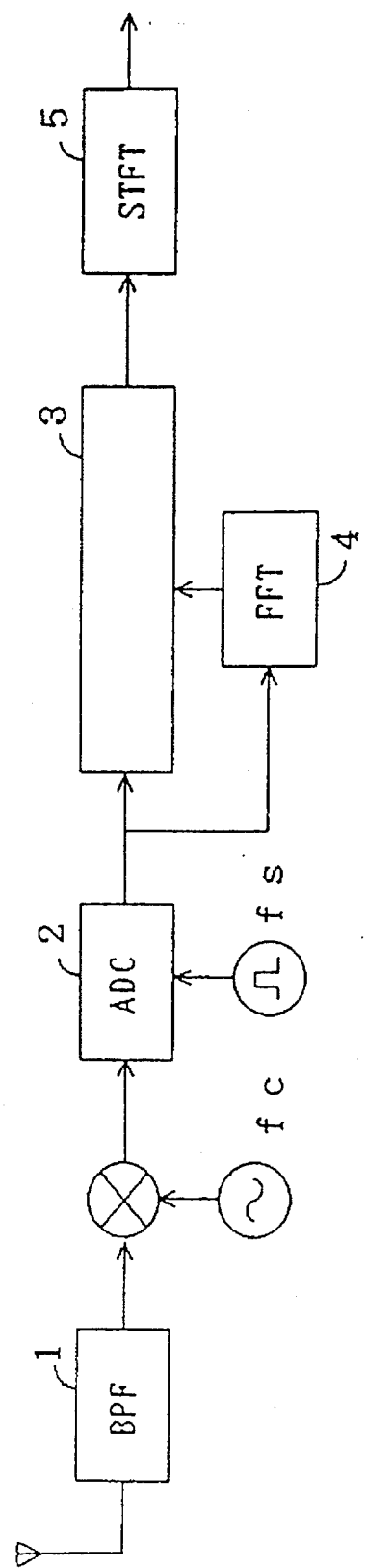
FIG. 2 is a block diagram showing an example of conventional Doppler compensation system.

FIG. 1 shows a preferred embodiment of the Doppler shift compensation apparatus of the present invention using a high resolution frequency analyzer. In FIG. 1, a band pass filter (BPF) 1 covers a frequency range encompassing both a carrier frequency and the Doppler shifted frequency received through an antenna. The output signal from the band pass filter 1 is converted and decreased its frequency by a local frequency $f_{LO}$ in a frequency converter 6. The frequency converted signal from the frequency converter 6 is supplied to a low pass filter (LPF) 11 wherein unnecessary image components are cut out. The signal from the low pass filter 11 is then converted to a digital signal by an analog-to-digital converter (ADC) 2 having a sampling frequency fs. The digital signal from the ADC 2 is sequentially stored in a memory 12.

The output of the memory 12 is supplied to a high resolution frequency analyzer 100. The high resolution frequency analyzer 100 utilizes a method of spectrum interpolation (hereinafter refereed to as SPIM), which is an essential part of the present invention, so that a frequency fn(t), an amplitude an(t), and a phase θ(t) with a high resolution can be obtained. Japanese patent application No. 311,956 filed in 1992 shows the details of such a high resolution frequency analyzer.

The high resolution frequency analyzer 100 is shown by the broken line in FIG. 1. The high resolution frequency analyzer 100 includes an interpolation judgment means 105, a spectrum interpolation means 107, an inverse Fourier transform means 108, a time-base accumulator 109, a subtractor 111, a frequency accumulator 112 and a summation means 113. The high resolution frequency analyzer 100 further includes a window function weighting means 103 and a Fast Fourier Transformer (FFT) 104. The interpolation judgment means 105 is provided at the output side of the FFT means 104. The spectrum interpolation means 107 executes the spectrum interpolation based on the interpolated results of the interpolation judgment means 105. The inverse Fourier transform means 108 inversely converts the frequency, amplitude and phase of the spectrum obtained by the spectrum interpolation means 107 into time base data. The time-base accumulator 109 accumulates the time base data which is converted by the inverse Fourier transform means 108. The subtractor 111 subtracts the accumulated result from the time base data which is read out from the memory 12, and inputs the subtracted result into the window function weighting means 103. The frequency accumulator 112 accumulates the frequency domain data which is interpolated by the spectrum interpolation means 107. The summation means 113 sums the frequency domain data accumulated in the accumulator 112 and the frequency domain data S'(t) obtained by FFTing the weighted time base data.

An example of the high resolution frequency analyzer 100 may be formed by a Short Time Fourier Transformation (STFT) since a high speed operation is possible in the STFT by employing the FFT. However, the frequency resolution in the STFT is not satisfactory. Thus, the conventional STFT is not suitable for a phase analysis which requires high resolution data.

Here, characteristics of a spectrum frequency interpolation method (SPIM) is analyzed for a system which includes the STFT in addition to a Hann window function means and an interpolation judgment means. The SPIM of the present invention achieves the high resolution frequency and phase analysis which is performed over a relatively short processing time.

The STFT is a frequency spectrum expressed utilizing the input data series x(t), as shown in Equation 1.

$$STFT(f) = \int x(t)g(t) \exp(-j2\pi ft)dt \quad (1)$$

In this equation, the window function is g(f) and is used to extract or define a finite data series. There are several suggestions for the window function. The observed frequency spectrum STFT(f) becomes the convolution integral of X(f), which is the Fourier transform of x(t), and G(f), which is the Fourier transform of g(t).

If the Fourier transform X(f) and G(f) are expressed as shown in Equations 2–3, $$X(f) = \int x(t) \exp(-j2\pi ft)dt \quad (2)$$

$$G(f) = \int g(t) \exp(-j2\pi ft)dt \quad (3)$$

then, $$SYFY(f) = \int X(f-u)G(u)du \quad (4)$$

In other words, if the input data train x(t) has a line spectrum f1, f2, ... fn, as expressed in Equation 5, and its interval is wider than the frequency band of the frequency spectrum G(f), then the frequency spectrum X(f) of the true input data series can be obtained from the observed frequency spectrum STFT(f).

$$x(t) = \sum_{i=1}^{m} a_i \cos(2\pi f_i t + \theta_i) \quad (5)$$

The requirements or conditions for the frequency spectrum G(f) of the window function are as follows. First, the energy spectrum frequency band of G(f) should be narrow for the separation of X(f). Second, the characteristics of the phase and frequency should be line-type for the phase analysis of X(f). Third, the amplitude of G(f) should be expressed in a simple equation in order to easily assume fi which is shown in Equation 5 from STFT(f).

In order to satisfy the above three conditions, the Hann window function is employed.

$$gh(t) = \begin{cases} 1 + \cos\left(\dfrac{2\pi t}{T}\right) & \left(\dfrac{-T}{2} < t < \dfrac{T}{2}\right) \\ 0 \ldots \text{(other domain)} \end{cases} \quad (6)$$

$$Gh(f) = \dfrac{0.5\sin\left[\pi T\left(f - \dfrac{1}{T}\right)\right]}{\left[\pi T\left(f - \dfrac{1}{T}\right)\right]} + \dfrac{\sin(\pi Tf)}{(\pi Tf)} + \dfrac{0.5\sin\left[\pi T\left(f + \dfrac{1}{T}\right)\right]}{\left[\pi T\left(f + \dfrac{1}{T}\right)\right]} \quad (7)$$

Equation 6 expresses the Hann window function.
Equation 7 expresses the frequency spectrum amplitude of Equation 6.
Equation 8 shows an alternate expression for Gh(f).

$$Gh(f) \cong \begin{cases} \text{amplitude: } 0.5\left[1 + \cos\left(\dfrac{\pi Tf}{2}\right)\right], \left(\dfrac{-2}{T} < f < \dfrac{2}{T}\right) \\ \text{phase: } \pi Tf \\ \text{amplitude: } 0 \ldots \text{(Other Domain)} \end{cases} \quad (8)$$

Thus, Equation 8 is very accurate in the frequency range of "$-1/T \leq f \leq 1/T$".

From the foregoing description, it may be easy to understand that the Hann window function is the most suitable window function for the window function weighting means 103. The input data series which is read out from memory 12 is weighted in accordance to the Hann window function in the window function weighting means 103. After the noise is removed, it is Fast Fourier Transformed (FFTed) by the FFT 104.

The frequency domain data STFT(f), which is FFTed by the Hann window function, is the discrete frequency spectrum computed utilizing the FFT algorithm. It is easy to analyze the true spectrum frequency, amplitude and phase ($f_i$, $a_i$, and $\theta_i$ in Equation 5) from this spectrum series by using Equations 4 and 8. Namely, three spectrum amplitudes and phases measured in the vicinity of $f_i$ are obtained by Equations 9–11.

$$STFT\left(\dfrac{n-1}{T}\right) \cong \begin{cases} \text{amplitude: } \dfrac{a_i}{2}\left[1 - \sin\left[\dfrac{\pi T \Delta f_i}{2}\right]\right] \\ \text{phase: } \theta_1 + \pi(T\Delta f_1 - 1) \end{cases} \quad (9)$$

$$STFT\left(\dfrac{n}{T}\right) \cong \begin{cases} \text{amplitude: } \dfrac{a_i}{2}\left[1 + \cos\left[\dfrac{\pi T \Delta f_i}{2}\right]\right] \\ \text{phase: } \theta_1 + \pi T\Delta f_i \end{cases} \quad (10)$$

$$STFT\left(\dfrac{n+1}{T}\right) \cong \begin{cases} \text{amplitude: } \dfrac{a_i}{2}\left[1 + \sin\left[\dfrac{\pi T \Delta f_i}{2}\right]\right] \\ \text{phase: } \theta_1 + \pi(T\Delta f_1 - 1) \end{cases} \quad (11)$$

$$\Delta f_i = f_i - n/T(-0.5/T \leq \Delta f_i < 0.5/T) \quad (12)$$

Reference symbol "n" is an integer. If n is found to be interpolative, the frequency $f_i$, amplitude $a_i$ and phase $\theta_i$ of the true spectrum can be obtained utilizing the interpolation process. The following steps should be performed in order to execute the interpolation process:

Step 1: Obtain three spectrums as defined by Equations 9–11.

Step 2: Compare the phases which are defined in Equations 9 and 11. If the difference between both phases is less than a predetermined value (π/36 radian), then it is said to be interpolative and the spectrum interpolation means 107 is subsequently activated. If the difference between both phases is more than the predetermined value (π/36 radian), then it is said to be a discrete spectrum due to the fluctuation and 1 is added to n and steps 1 and 2 are repeated.

Step 3: Add the amplitude defined in Equations 9 and 11 to the amplitudes obtained utilizing the spectrum interpolation means 107 in order to get the true amplitude $a_i$ of the line spectrum.

Step 4: Subtract $a_i/2$ from the amplitude of Steps 1–3, respectively, in order to obtain $\Delta f_i$. Then, calculate the true frequency $f_i$ from $\Delta f_i$ using Equation 13.

$$f_i = n/T + \Delta f_i \tag{13}$$

Step 5: Calculate the true phase $\theta_i$ (absolute phase) from the phase expressed in Equation 10 and $\Delta f_i$ $$\theta_i = STFT(n/t)_{phase} - \pi T \Delta f_i \tag{14}$$

After the frequency $f_i$, amplitude $a_i$ and phase $\theta_i$ of the true spectrum are obtained from the spectrum interpolation means 107, the frequency domain data is transferred to the single spectrum inversion Fourier transformer 108 so as to invert the single line spectrum into time base data. Then, the time base data is transferred to and accumulated by the accumulator 109.

The time base data accumulated in the accumulator 109 is transferred to the subtractor 111 and subtracted from the data series which is read from the memory 12. The data obtained from the subtraction process is FFTed again by the FFT 104. Thus, the three spectrums defined by Equations 9–11 are basically removed and the frequency domain data of the true spectrum is accumulated in the accumulator 112.

The judging and interpolation processes are performed from n=2 to n=k–1 (Wherein k represents ½ of the time domain data). The frequency domain data of the true spectrum which is accumulated in the accumulator 112 is vector-summed to the FFTed data utilizing the summation means 113. Then, the summed result is displayed on the high resolution frequency analyzer 100.

As described in the foregoing, according to the function of the high resolution frequency analyzer 100 used in the present invention, if three frequency spectrum exist next to each other among the discrete frequency spectrums obtained by the Fourier transform, and if the phase of the top and bottom spectrum are within the allowed value, then these three frequency spectrum are found to be the true, discrete line spectrum. The frequency $f_i$, amplitude $a_i$ and phase $\theta_i$ of the true spectrum are obtained using the interpolation process. The true line spectrum data is accumulated in the accumulator 112 and inversely converted to the time base data by the inverse Fourier transform means. The time base data is accumulated by the accumulator 109 and subtracted from the input data series. After determining the true line spectrum via the interpolation process, the remaining energy is lowered. Thus, the line spectrum is not spread out but, rather, is displayed as a spectrum of lines. As a result, the resolution of the spectrum is improved. Further, since the amplitude and phase are calculated close to the true value, the amplitude and phase can be measured with a higher accuracy.

In the foregoing embodiment, the feed back loop that consists of inverse Fourier transform means 108 and accumulator 109 is formed. But removing the feed back loop, only ($a_i$, $f_i$, $\theta_i$) can be used. Yet, a feed back loop is composed, when a slight signal is taken out.

In the foregoing embodiment, the results of the spectrum interpolation are separately accumulated in the accumulators 109 and 112. However it is also possible to provide the accumulator 112 with only the output side of the vector interpolation means 107, so that the interpolated results are solely accumulated in the accumulator 112. For this case, an entire spectrum inversion Fourier transform means is used so as to Fourier-invert the entire accumulated spectrum.

A low pass filter 11 can be added in front of the AD converter 2 in order to remove sampling aliasing errors. Modifications to the transmission function (i.e., frequency characteristics of the amplitude and phase) may be performed on the input signals.

Next, regarding the frequency range about the output from high resolution frequency analyzer 100, a regular Regression computation was carried out as Fn(t) by a regression computation means 13.

Corresponding to Fn(t), reduction is carried out from fn(t) with subtractor 15. As a result, Doppler shift is compensated and fn'(t) have been obtained. Also, regarding the phase range, regression computation means 13 output Fn(t) and a regular integration computation was carried out by integration computation means 14. Corresponding as a result, θn(t) are carried out with subtractor 16. As a result, the Doppler shift is compensated and the phase θn'(t) has been obtained. Also, the result an(t) from high resolution frequency analyzer 100 is used as it is regarding the amplitude range.

The next computation is carried out at the regression computation means 13, here. Generally, a regression style of case of a polynomial expression is as follows. It becomes, as follows time predicts and make y a function of x and obtain the data of 2 variables (x, y) here.

$$\begin{bmatrix} n & \Sigma_{xk} & \ldots & \Sigma_{xk^m} \\ \Sigma_{xk} & \Sigma_{xk^2} & \ldots & \Sigma_{xk^{m+1}} \\ | & | & & | \\ \Sigma_{xk^m} & \Sigma_{xk^{m+1}} & \ldots & \Sigma_{xk^{2m}} \end{bmatrix} \begin{bmatrix} a_0 \\ a_1 \\ | \\ a_m \end{bmatrix} \begin{bmatrix} \Sigma_{yk} \\ \Sigma_{xkyk} \\ | \\ \Sigma_{xk^myk} \end{bmatrix} \tag{15}$$

Like this, the regression curve parameter, (a0, a1, am) is determined by an opposite procession.

Also, at integrations computation means 14, the next computation is carries out.

$$\int_0^t 2\pi Fn(\tau) d\tau \tag{16}$$

fn'(t), θn'(t), an(t) is output as the signal that completed Doppler compensation from output means 17, as above.

Accordingly, desired signal processing can be performed such processes as measuring and displaying the output signal or analyzing demodulated signal of the output signal where the output signal has been compensated for Doppler shift.

The effect of the present invention utilizing the SPIM is shown with reference to the conventional technology using the STFT is described based on actual spectrum analysis examples in FIGS. 3 and 4.

FIG. 3 and 4 show multiple tone signals of FIGS. 9 conditions which is an example that analyzed frequency spectrum by using the STFT and the SPIM under the window time T=1 sec and 64 sampling data points in equation (5). Here, a spectrum analysis is performed by incorporating a zero filling processing to the data of 64 points so that the data is expanded to 512 points. The sampling bits for the time domain wave are 4-bit and 8-bit, respectively, to see an influence of the noise on the analysis result of each test method. In FIGS. 3 and 4, the lines show analysis values and the dots show real spectrum positions.

Figure 3B:
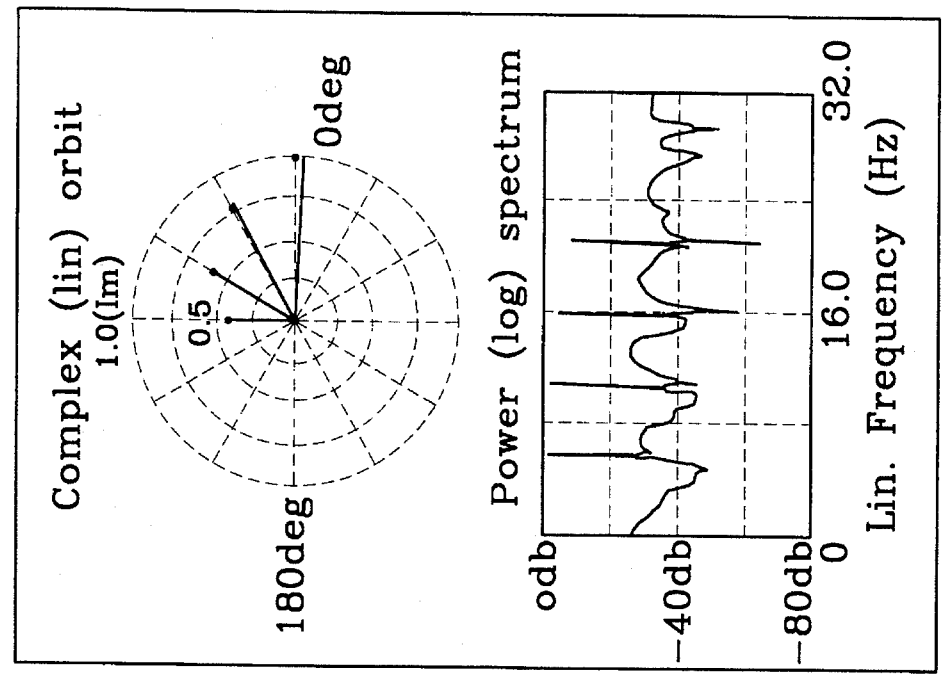
FIG. 3B shows an example of analyzing a multiple tone signal with a 4-bit ADC and a spectrum interpolation method (SPIM) of the present invention.
Figure 3A:
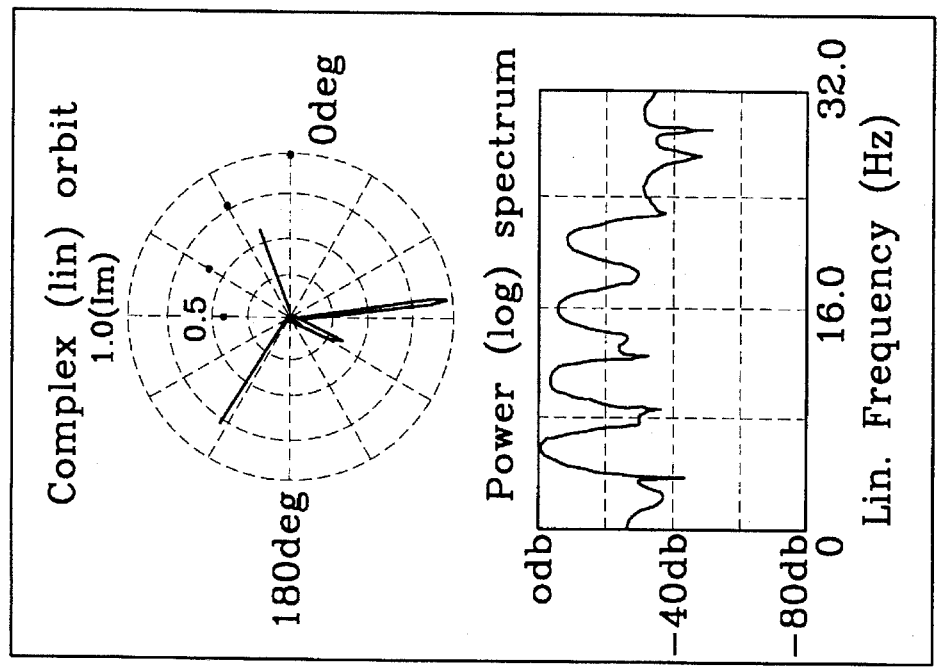
FIG. 3A shows an example of analyzing a multiple tone signal with a 4-bit ADC and a conventional method using fast Fourier transformer (FFT).

FIG. 3(A) is the STFT spectrum that was analyzed by the sampling number of 4-bit. FIG. 3(A) shows the situation where the analyzed spectrum spreads because of the time window. Also, as may be understood from the complex orbit, the phase analysis in this measurement has no meaning since it does not show any accurate data.

FIG. 3(B) is the SPIM spectrum that was analyzed by the sampling number of 4-bit. The analyzed spectrum is shown on positions corresponding to true frequency values. As also may be understood from the complex orbit, the analyzed phases are accurate for the most part. However, due to the sampling noise, the analyzed spectrum has errors at about minus 30 dBc.

Figure 4B:
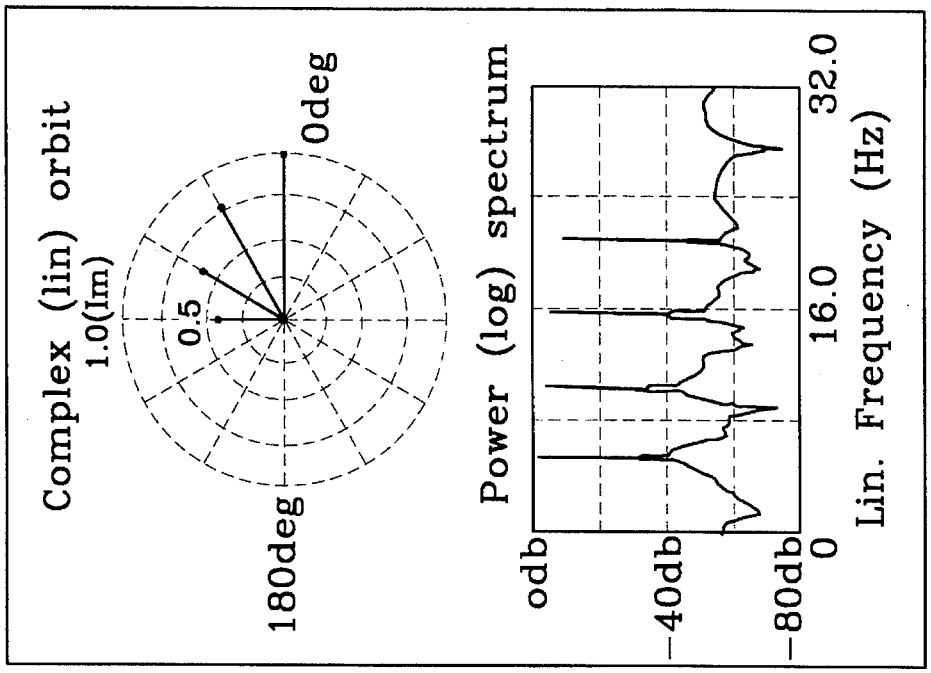
FIG. 4B shows an example of analyzing a multiple tone signal with a 8-bit ADC and a spectrum interpolation method (SPIM) of the present invention.
Figure 4A:
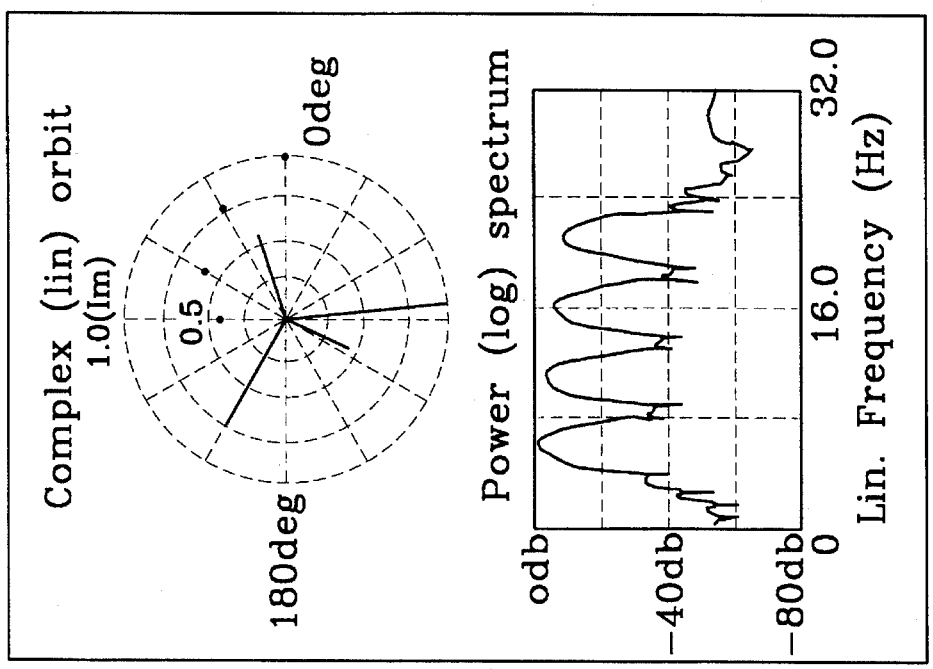
FIG. 4A shows an example of analyzing a multiple tone signal with a 8-bit ADC and a conventional method using fast Fourier transformer (FFT).
Figure 8A:
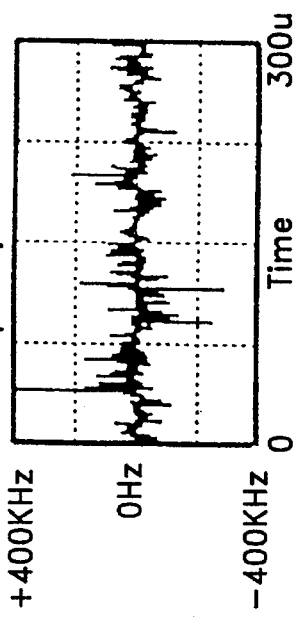
FIG. 8 shows instantaneous spectrum versus time after the Doppler shift compensation.
Figure 8B:
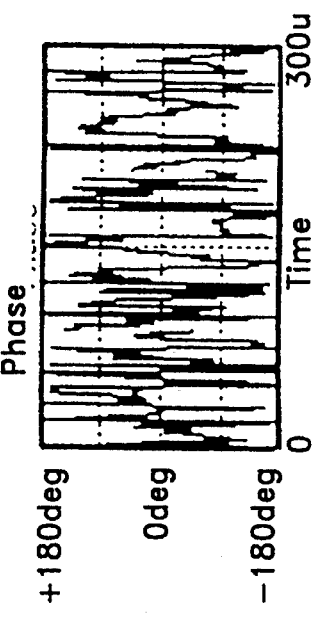
Figure 8C:
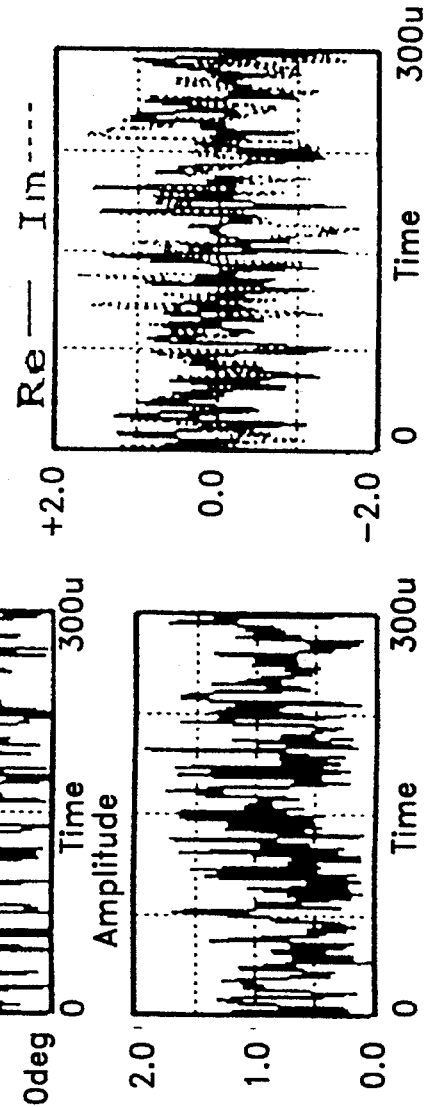
Figure 8D:
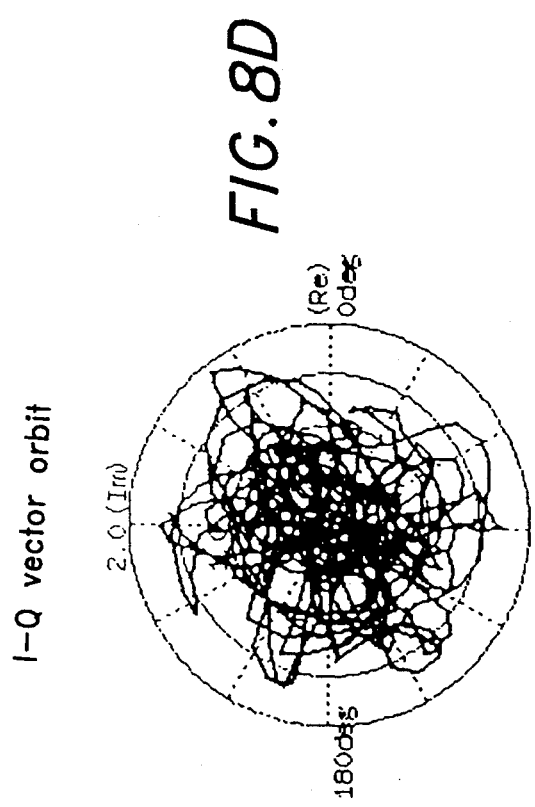
Figure 8E:
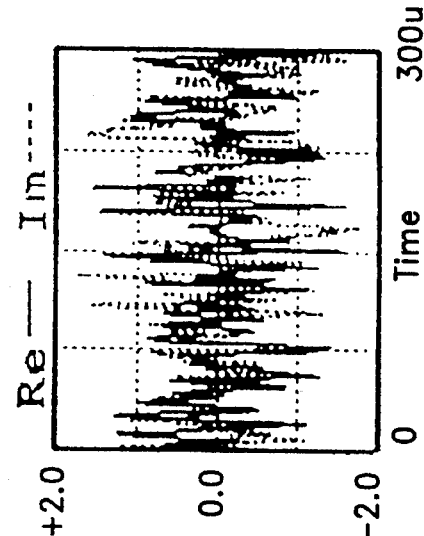

FIG. 4(A) is the STFT spectrum that was analyzed with 8-bit sampling rate. It is same for the most part with the analysis result of FIG. 3 (A). FIG. 4(B) is the SPIM spectrum that was analyzed with 8-bit sampling rate. The error in the analyzed spectrum is decreased to about minus 50 dBc since the sampling noise is decreased as can be seen in comparison with FIG. 3(B). As also seen in the complex orbit of FIG. 4(B), both phase and amplitude almost completely agree with the true spectrum positions.

FIG. 10 shows the relationship between the number of sampling bits and the SPIM spectrum analysis errors. As is well anticipated, the number of sampling bits increases the errors decreases accordingly.

The ratio of the implementation time in the conventional STFT and the present invention SPIM is about 2 while the analysis error in the present invention SPIM is improved by a range of 1/100–1/1000 from the conventional STFT method.

The system response simulation result to a direct cross vector spectrum dispersion signal that received the Doppler shifts in FIG. 6, 7, 8 is shown. This analysis is carried out in a system of FIG. 1 by adapting a window time T=1 μs, a frame time 300 μs, and a sampling frequency 32 MHz.

FIG. 6 shows a situation of reception spectrum dispersion. FIG. 7 shows an instantaneous spectrum time change that does not compensate for Doppler. FIG. 8 shows an instantaneous spectrum time change after Doppler compensation. As seen in the orbit displays of FIGS. 7 and 8 (orbit), this method is very effective in applying SS signals.

FIG. 5 shows examples of waveform before and after the Doppler compensation in accordance with the present invention. An intermediate frequency (IF) signal from the low pass filter 11 has a carrier frequency of 10 kHz. It receives a phase and amplitude modulation. It accompanies the Doppler shifts of 1 kHz/sec. The analogue digital converter (ADC) 2 having a sampling frequency 32 kHz analyzes a signal of 300 ms each for the memory 12.

As shown in FIG. 5(A1), an input frequency fn(t) accompanies the Doppler shifts. After the Doppler shifts compensation, an output frequency f'n(t) of FIG. 5(A2) becomes constant. Also, as shown in FIG. 5(B1), an input phase θ'n(t) accompanies the Doppler shifts so that a coherency of phase is not observable. In FIG. 5(B2) showing the situation after the Doppler shifts compensation, the waveform shows a constant phase θ'n(t). Further, an output amplitude is the present invention is stabilized as shown in FIGS. 5(C1) and (C2).

As has been foregoing, the signal outputs f'n(t), θn'(t), an(t) which have been compensated in terms of the Doppler shift are taken out from the output means 17. Such compensation is performed by using a high resolution frequency analyzer of this invention.

Accordingly, optional signal processing is able to be carried out to indicate and carry out measuring processing and also analyze and recover usual form for an output signal that was compensated for Doppler frequency shift.

Like this, Doppler shift was compensated, by using a high resolution frequency analyzer that can detect an amplitude and a phase of spectrum accurately and has high frequency dissolution ability.

Carrying out high quality recovery and measurement Doppler compensation apparatus is thus possible.

What is claimed is:

1. A Doppler shift compensation apparatus, comprising:

an analog to digital converter which transforms an analog input signal including Doppler frequency shifts to a series of digital data;

a memory which stores said serial digital data from said analog to digital converter;

a window function weighting part for multiplying and weighting a specified window function to a part of input data read out from said memory;

a fast Fourier transformer (FFT) for transforming said input data to frequency spectrum data;

an interpolation judgment part which distinguishes line spectrum from dispersed spectrum in said frequency spectrum data from said fast Fourier transformer and judges that an interpolation be possible when said line spectrum is found;

a spectrum interpolator which measures the true frequency, amplitude and phase of the line spectrum based on the judgement of said interpolation judgement part;

an accumulator for accumulating the frequency domain data interpolated by said spectrum interpolator;

a summation part for vector-summing the frequency domain data accumulated by said accumulator to a Fourier transform output of said fast Fourier transformer;

a regression computation part for performing a predetermined regression computation for the frequency data from said summation part based on the output data from said interpolation judgment part; and a first subtractor for subtracting the output data of said regression computation part from said frequency data of said summation part, wherein the subtracted result is compensated in terms of said Doppler frequency shift.

2. A Doppler shift compensation apparatus as defined in claim 1, wherein said apparatus further includes:

an integrations computation part for integrating and computing the output data from said Regression computation part;

a second subtractor for subtracting the output data of said integrations computation part from phase data provided from said summation part; and an output circuit for outputting amplitude data from said summation part, the frequency data from said first subtractor, and phase data which is Doppler shifts uncompensated from said second subtractor.

3. A Doppler shift compensation apparatus as defined in claim 1, wherein said apparatus further includes:

an inverse Fourier transformer for performing an inverse Fourier transformation for the frequency data interpolated from said spectrum interpolator to obtain time domain data corresponding to said interpolated data;

a second accumulator for accumulating the time domain data from said inverse Fourier transformer;

a third subtractor for subtracting the data from said second accumulator from said input data from said memory.

* * * * *